United States Patent
Mori et al.

(10) Patent No.: US 11,220,759 B2
(45) Date of Patent: Jan. 11, 2022

(54) METHOD OF MANUFACTURING A GROUP III-NITRIDE CRYSTAL COMPRISING A NUCLEATION STEP, A PYRAMID GROWTH STEP, A LATERAL GROWTH STEP, AND A FLAT THICK FILM GROWTH STEP

(71) Applicants: OSAKA UNIVERSITY, Osaka (JP); Panasonic Corporation, Osaka (JP)

(72) Inventors: Yusuke Mori, Osaka (JP); Masayuki Imanishi, Osaka (JP); Masashi Yoshimura, Osaka (JP); Kousuke Murakami, Osaka (JP); Shinsuke Komatsu, Osaka (JP); Masahiro Tada, Osaka (JP); Yoshio Okayama, Osaka (JP)

(73) Assignees: OSAKA UNIVERSITY, Osaka (JP); PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/783,229

(22) Filed: Feb. 6, 2020

(65) Prior Publication Data
US 2020/0263317 A1    Aug. 20, 2020

(30) Foreign Application Priority Data
Feb. 18, 2019  (JP) .............................. JP2019-026845

(51) Int. Cl.
*C30B 19/10*  (2006.01)
*C30B 19/12*  (2006.01)
(Continued)

(52) U.S. Cl.
CPC .............. *C30B 19/12* (2013.01); *C30B 19/02* (2013.01); *C30B 29/403* (2013.01)

(58) Field of Classification Search
CPC .... C30B 9/00; C30B 9/04; C30B 9/08; C30B 9/10; C30B 9/12; C30B 19/00;
(Continued)

(56) References Cited

U.S. PATENT DOCUMENTS 10,927,476 B2 *  2/2021  Mori ....................... C30B 19/10
2004/0183090 A1  9/2004  Kitaoka et al.
(Continued)

FOREIGN PATENT DOCUMENTS

JP    4538596    9/2010
JP    4588340    12/2010
(Continued)

*Primary Examiner* — Kenneth A Bratland, Jr.
(74) *Attorney, Agent, or Firm* — Wenderoth, Lind & Ponack L.L.P.

(57) ABSTRACT

A method of manufacturing a group-III nitride crystal includes: a seed crystal preparation step of preparing a plurality of dot-shaped group-III nitrides on a substrate as a plurality of seed crystals for growth of a group-III nitride crystal; and a crystal growth step of bringing surfaces of the seed crystals into contact with a melt containing an alkali metal and at least one group-III element selected from gallium, aluminum, and indium in an atmosphere containing nitrogen and thereby reacting the group-III element with the nitrogen in the melt to grow the group-III nitride crystal.

6 Claims, 22 Drawing Sheets

(51) Int. Cl.
*C30B 19/02* (2006.01)
*C30B 29/40* (2006.01)

(58) Field of Classification Search
CPC ......... C30B 19/02; C30B 19/08; C30B 19/10;
C30B 19/12; C30B 29/00; C30B 29/10;
C30B 29/40; C30B 29/403; C30B 29/406
USPC ... 117/11, 13, 36, 54, 56, 58, 60, 64, 73–74,
117/77–79, 937, 952
See application file for complete search history.

(56) References Cited

U.S. PATENT DOCUMENTS

| | | | |
|---|---|---|---|
| 2005/0048686 A1* | 3/2005 | Kitaoka | H01L 29/66856 |
| | | | 438/46 |
| 2010/0059717 A1 | 3/2010 | Mori et al. | |
| 2014/0328742 A1 | 11/2014 | Mori et al. | |
| 2017/0073839 A1 | 3/2017 | Mori et al. | |
| 2017/0073840 A1 | 3/2017 | Mori et al. | |
| 2018/0038010 A1* | 2/2018 | Mori | H01L 21/02634 |
| 2019/0271096 A1* | 9/2019 | Mori | C30B 29/406 |

FOREIGN PATENT DOCUMENTS

| | | |
|---|---|---|
| JP | 5904421 | 4/2016 |
| WO | 2015/133379 | 9/2015 |
| WO | 2015/133443 | 9/2015 |
| WO | 2016/140074 | 9/2016 |

* cited by examiner

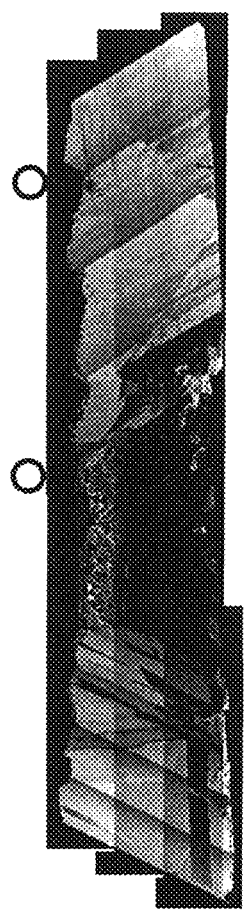
Fig. 11A
Fig. 11B

METHOD OF MANUFACTURING A GROUP III-NITRIDE CRYSTAL COMPRISING A NUCLEATION STEP, A PYRAMID GROWTH STEP, A LATERAL GROWTH STEP, AND A FLAT THICK FILM GROWTH STEP

CROSS-REFERENCE TO RELATED APPLICATIONS

This application claims priority of Japanese Patent Application No. 2019-26845 filed on Feb. 18, 2019, the contents of which is incorporated herein by reference.

BACKGROUND

1. Technical Field

The present disclosure relates to a method of manufacturing a group-III nitride crystal.

2. Description of the Related Art

A group-III nitride is a material for a blue LED element that is a display device or a power device such as a vehicle-mounted device and is recently attracting attention. Particularly, the group-III nitride is expected to be applied as a power device and has superior performance such as high withstand voltage and high temperature resistance characteristics as compared to currently commercially available Si. One of known methods of manufacturing such a group-III nitride crystal is a flux method in which a group-III element is reacted with nitrogen in an alkali metal melt (flux) of Na etc. to grow a high-quality crystal with less crystal defect (dislocation) (see, e.g., Japanese Patent No. 4538596). For obtaining group-III nitride crystals having a large size of 4 inches or more, other disclosed methods comprise selecting as seed crystals multiple portions of a group-III nitride layer formed on a seed sapphire substrate having a lattice constant similar to sapphire by metal-organic chemical vapor deposition (MOCVD) and bringing the seed crystals into contact with an alkali metal melt to grow a group-III nitride crystal (see, e.g., Japanese Patent Nos. 4588340 and 5904421).

However, when a single group-III nitride wafer is produced from multiple seed crystals as disclosed in Patent Document 3, a conventional manufacturing method is limited in terms of quality improvement. FIG. 1 shows X-Ray Rocking Curve (XRC) data of a group-III nitride crystal produced by a conventional manufacturing method, and FIG. 2 shows a 170 μm square field image of cathodoluminescence (CL) taken by imaging a crystal surface. It is seen that the conventional crystal has a crystallinity of 32 to 69 arcsec from the XRC of FIG. 1 and a dislocation density of $5.8 \times 10^5$ cm$^{-2}$ from the CL of FIG. 2.

SUMMARY

One non-limiting and exemplary embodiment provides a method of manufacturing a high-quality group-III nitride crystal with favorable crystallinity.

In one general aspect, the techniques disclosed here feature: a method of manufacturing a group-III nitride crystal including:

a seed crystal preparation step of preparing a plurality of dot-shaped group-III nitrides on a substrate as a plurality of seed crystals for growth of a group-III nitride crystal; and a crystal growth step of bringing surfaces of the seed crystals into contact with a melt containing an alkali metal and at least one group-III element selected from gallium, aluminum, and indium in an atmosphere containing nitrogen and thereby reacting the group-III element with the nitrogen in the melt to grow the group-III nitride crystal, wherein the crystal growth step includes:

a nucleation step of forming crystal nuclei from the plurality of seed crystals;

a pyramid growth step of growing a plurality of pyramid-shaped first group-III nitride crystals from the plurality of crystal nuclei; and a lateral growth step of growing second group-III nitride crystals so that gaps of the plurality of pyramid-shaped first group-III nitride crystals are filled to form a flattened surface.

According to the present disclosure, in a manufacturing method for manufacturing a group-III nitride crystal by growing and combining group-III nitride crystals from multiple seed crystals, a high-quality group-III nitride crystal with less crystal defects and impurities can be obtained.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF THE DRAWINGS

The present disclosure will become readily understood from the following description of non-limiting and exemplary embodiments thereof made with reference to the accompanying drawings, in which like parts are designated by like reference numeral and in which:

FIG. 11A is a microscopic image of a cross section of a crystal obtained by growing GaN at 870° C. and then growing GaN at 890° C.;

FIG. 11B is a cross-sectional CL image of a cross section of a crystal obtained by growing GaN at 870° C. and then growing GaN at 890° C.;

DETAILED DESCRIPTION

Figure 1:
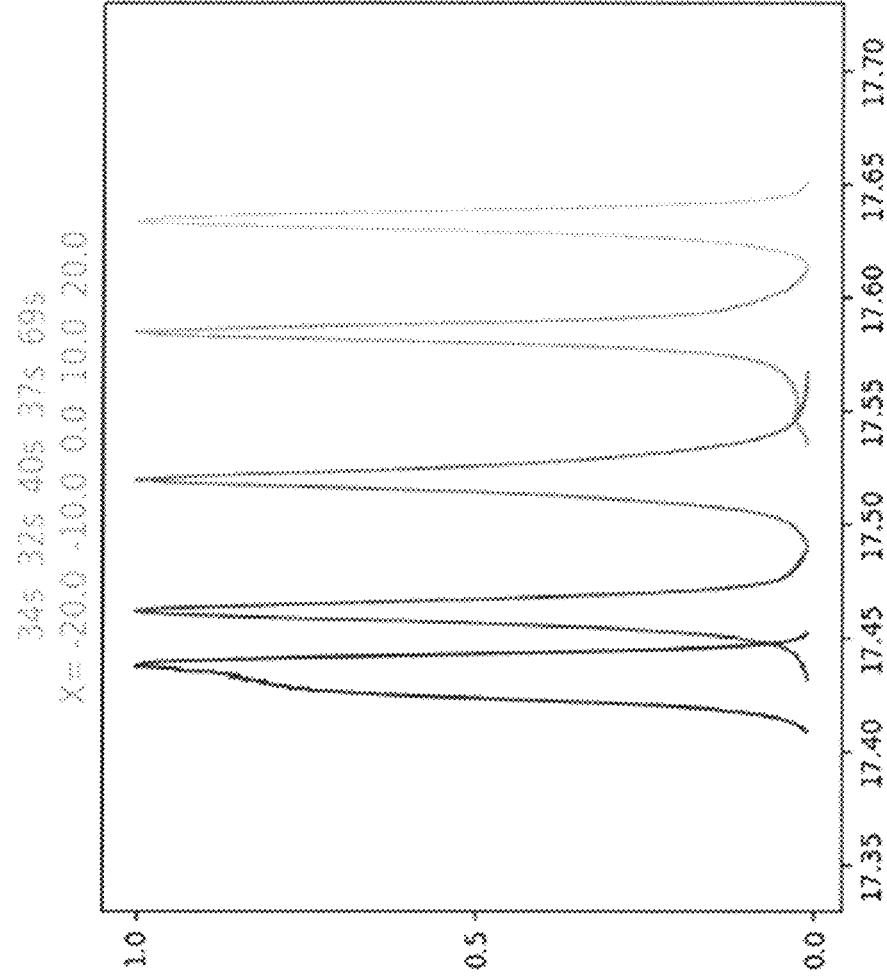
FIG. 1 is XRC of a group-III nitride crystal produced by a conventional manufacturing method.
Figure 2:
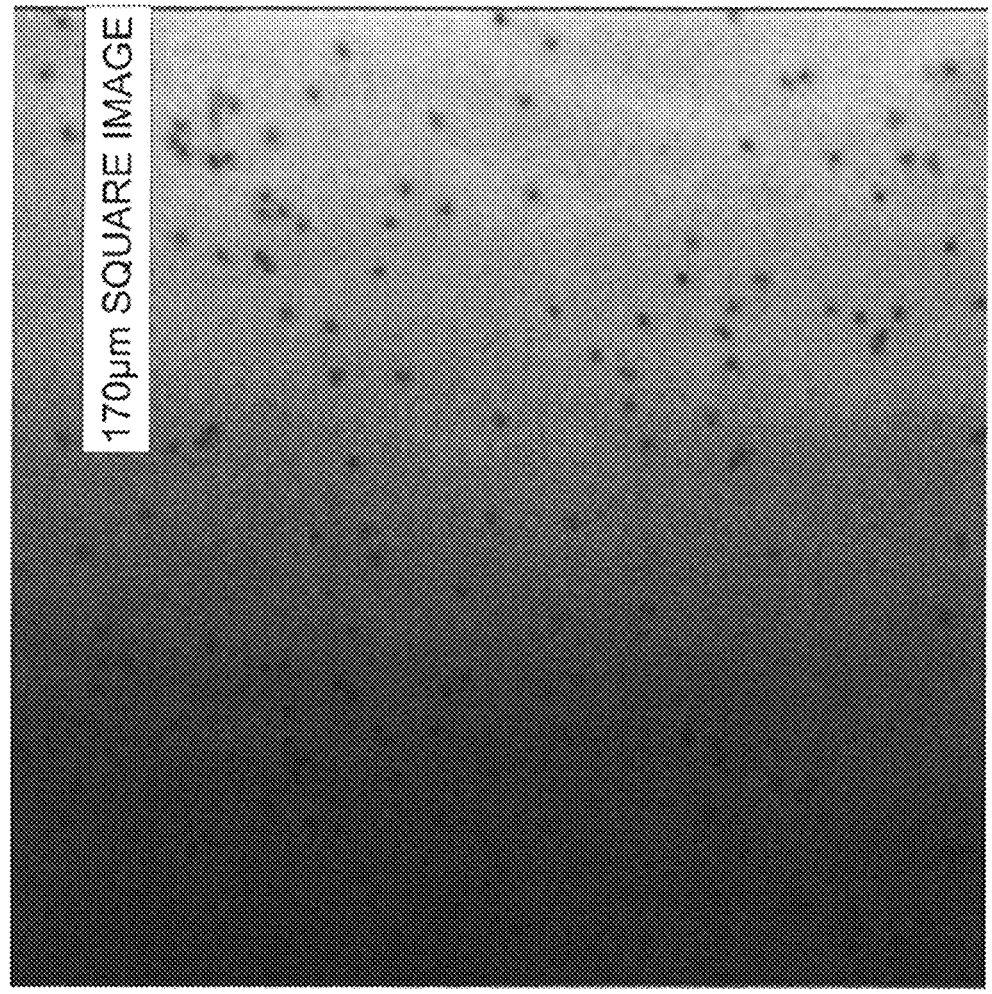
FIG. 2 is a surface dislocation image (170 μm square field image) of the group-III nitride crystal produced by the conventional manufacturing method.

A method of manufacturing a group-III nitride crystal, according to a first aspect, including:

a seed crystal preparation step of preparing a plurality of dot-shaped group-III nitrides on a substrate as a plurality of seed crystals for growth of a group-III nitride crystal; and a crystal growth step of bringing surfaces of the seed crystals into contact with a melt containing an alkali metal and at least one group-III element selected from gallium, aluminum, and indium in an atmosphere containing nitrogen and thereby reacting the group-III element with the nitrogen in the melt to grow the group-III nitride crystal, wherein the crystal growth step includes:
a nucleation step of forming crystal nuclei from the plurality of seed crystals;
a pyramid growth step of growing a plurality of pyramid-shaped first group-III nitride crystals from the plurality of crystal nuclei; and
a lateral growth step of growing second group-III nitride crystals so that gaps of the plurality of pyramid-shaped first group-III nitride crystals are filled to form a flattened surface.

The method of manufacturing a group-III nitride crystal according to a second aspect, in the first aspect, the nucleation step may be performed at 874° C. or less.

The method of manufacturing a group-III nitride crystal according to a third aspect, in the first aspect, at the nucleation step, the plurality of seed crystals may be immersed in the melt within 5 minutes to 10 hours.

The method of manufacturing a group-III nitride crystal according to a fourth aspect, in the first aspect, the pyramid growth step may be performed at a crystal growth temperature of 877° C. or more.

The method of manufacturing a group-III nitride crystal according to a fifth aspect, in the first aspect, at the lateral growth step, multiple group-III nitride crystal layers may be formed on inclined planes of the pyramid-shaped first group-III nitride crystals by repeatedly immersing the substrate into the melt and pulling up the substrate from the melt.

The method of manufacturing a group-III nitride crystal according to a sixth aspect, in the first aspect, the lateral growth step may be performed at a crystal growth temperature of 877° C. or more.

The method of manufacturing a group-III nitride crystal according to a seventh aspect, in the first aspect, the pyramid growth step may be performed at the same temperature as the crystal growth temperature of the lateral growth step.

The method of manufacturing a group-III nitride crystal according to an eighth aspect, in any one of the first aspect to the seventh aspect, the crystal growth step may further include a flat thick film growth step of growing a third group-III nitride crystal having a flat surface after the lateral growth step.

The method of manufacturing a group-III nitride crystal according to a ninth aspect, in any one of the first aspect to the eighth aspect, may further include a step of separating the group-III nitride crystal and the substrate after the crystal growth step.

The method of manufacturing a group-III nitride crystal according to a tenth aspect, in the second aspect, wherein the pyramid growth step may be performed at a crystal growth temperature of 877° C. or more.

Background to the Present Inventions

First, regarding manufacturing of a GaN crystal by the inventors, a method of manufacturing a group-III nitride crystal of a reference example will be described in detail.

(Seed Crystal Preparation Step)

Figure 3:
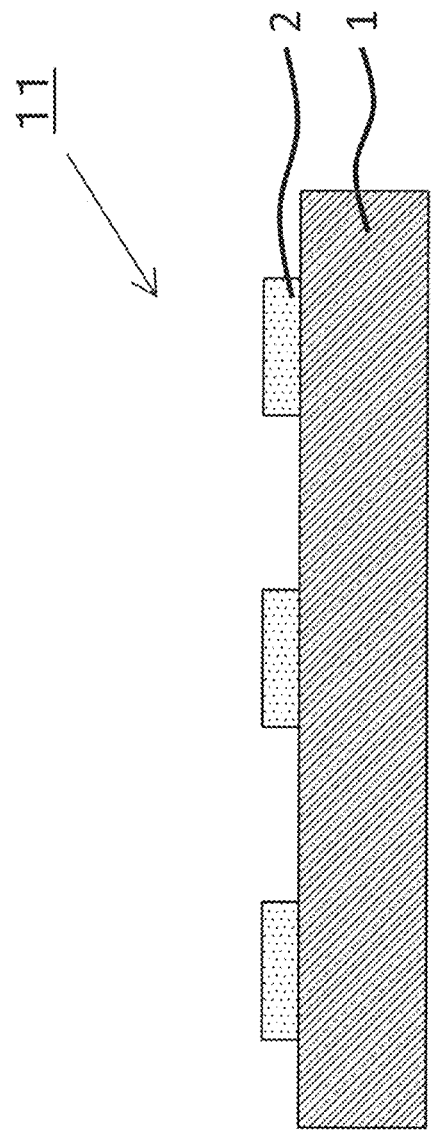
FIG. 3 is a cross-sectional view of a seed substrate comprising multiple dot-shaped GaN crystals.

(1) FIG. 3 shows a schematic sectional view of an example of a substrate 11 comprising multiple dot-shaped GaN crystals. A seed crystal substrate 1 made of sapphire is first prepared as a substrate for manufacturing a crystal. Sapphire is used since differences in lattice constant and thermal expansion coefficient from GaN are relatively small. In addition, for example, SIC, GaAs, $ScAlMgO_4$, etc. can be used other than sapphire. The thickness of the seed crystal substrate 1 may be about 100 to 3000 μm, for example, 400 to 1000 μm. The thickness of the seed crystal substrate 1 within the range makes the strength sufficiently high so that a crack etc. hardly occur during manufacturing of GaN crystals. The seed crystal substrate 1, for example, has a wafer shape having a diameter of about 50 to 200 mm in consideration of industrial applications.

(2) A thin film (not shown) made up of GaN single crystals is formed by the MOCVD method on the seed crystal substrate 1 made of sapphire. The thickness of the thin film may be about 0.5 to 20 μm, for example, 1 to 5 μm. When the thickness of the thin film is 0.5 μm or more, the formed thin film has favorable single crystals, and lattice defects etc. hardly occur in the GaN crystals to be obtained.

(3) A portion of the thin film made up of GaN single crystals is then removed by a known method using photolithography and etching to form group-III nitride seed crystals 2 that are multiple dot-shaped GaN seed crystals. The dot size of the GaN seed crystals 2 may be about 10 to 1000 μm, for example, 50 to 300 μm. The dot pitch may be about 1.5 to 10 times, for example, 2 to 5 times of the dot size. The dot shape may be a circle or a hexagon. The size, arrangement, pitch, and shape of the dots within the ranges facilitate initial nucleation and pyramid growth as well as combination between GaN crystals during GaN crystal growth in the flux method and provide an effect that dislocations inherited from the seed crystals can efficiently be reduced.

Although the dots are formed after the GaN thin film is formed by MOCVD on the sapphire substrate in the case described above, the MOCVD thin film may selectively be grown by using a mask. Specifically, the multiple dot-shaped group-III nitride seed crystals 2 may be formed by a method comprising disposing a mask provided with dot hole shapes on sapphire and forming GaN thin films by MOCVD only in dot holes. As a result, the substrate 11 comprising the multiple group-III nitride seed crystals 2 is prepared.

(GaN Crystal Growth Step)

(4) A step of forming GaN crystals on the group-III nitride seed crystals 2 of the substrate 11 by the flux method will be described.

(Pyramid Growth Step)

Figure 4:
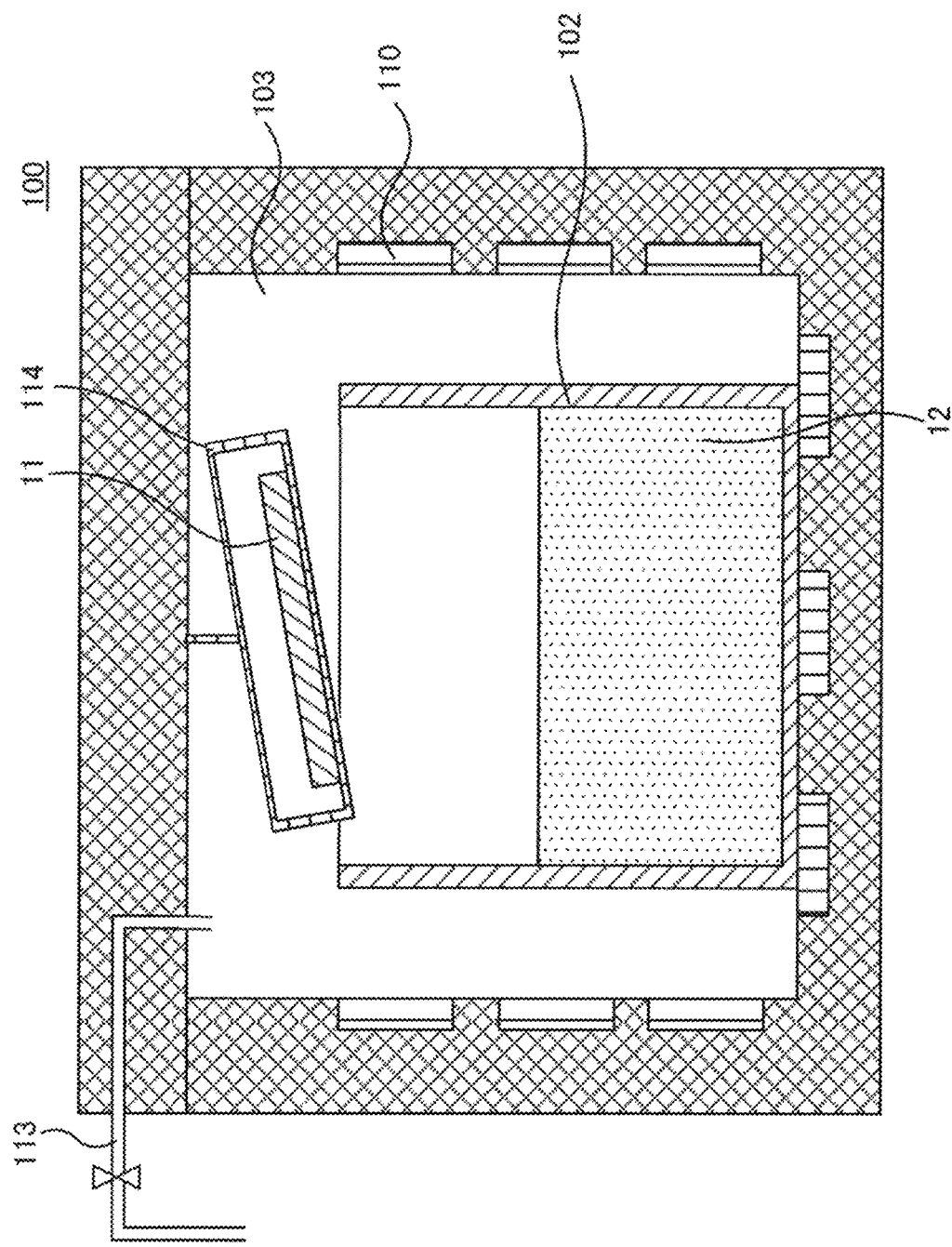
FIG. 4 is a schematic cross-sectional view of an example of a group-III nitride crystal manufacturing apparatus used in an embodiment of the present disclosure.

As shown in FIG. 4, a manufacturing apparatus 100 comprises a reaction chamber 103 made of stainless steel, a heat insulating material, etc., and a crucible 102 is disposed in the reaction chamber 103. The crucible can be a crucible made of boron nitride (BN), alumina ($Al_2O_3$), etc. A heater 110 is disposed around the reaction chamber 103, and the heater 110 is designed such that the temperature inside the reaction chamber 103, or particularly inside the crucible 102 can be adjusted. In the manufacturing apparatus 100, a substrate holding mechanism 114 is disposed for holding the substrate 11 comprising the GaN seed crystals such that the substrate can be moved up and down. A nitrogen gas supply line 113 for supplying nitrogen gas is connected to the reaction chamber 103, and the nitrogen gas supply line 113 is connected to a raw material gas cylinder (not shown) etc.

(4-1) At the time of GaN crystal growth, first, Na serving as a flux and a group-III element Ga are put into the crucible 102 in the reaction chamber 103 of the manufacturing apparatus 100. The input amounts of Na and Ga are about 85:15 to 50:50 in molar quantity ratio, for example. At this point, a trace additive may be added as needed.

(4-2) The inside of the reaction chamber 103 is sealed, the temperature of the crucible is adjusted to 800° C. or more and 1000° C. or less, and nitrogen gas is sent into the reaction chamber 103. In this case, the gas pressure in the reaction chamber 103 is set to $1 \times 10^6$ Pa or more and $1 \times 10^7$ Pa or less. By increasing the gas pressure in the reaction chamber 103, nitrogen is easily dissolved in Na melted at a high temperature, and the GaN crystals can rapidly be grown by setting the temperature and pressure as described above.

(4-3) Subsequently, holding or stirring and mixing etc. are performed until Na, Ga, and the trace additive are uniformly mixed. The holding or the stirring and mixing may be performed for 1 to 50 hours. By performing the holding or the stirring and mixing for such a time, Na, Ga, and the trace additive can uniformly be mixed. At the time of mixing, nitrogen is most dissolved at a temperature around 870° C., which is suitable for subsequent pyramid growth.

Figure 5:
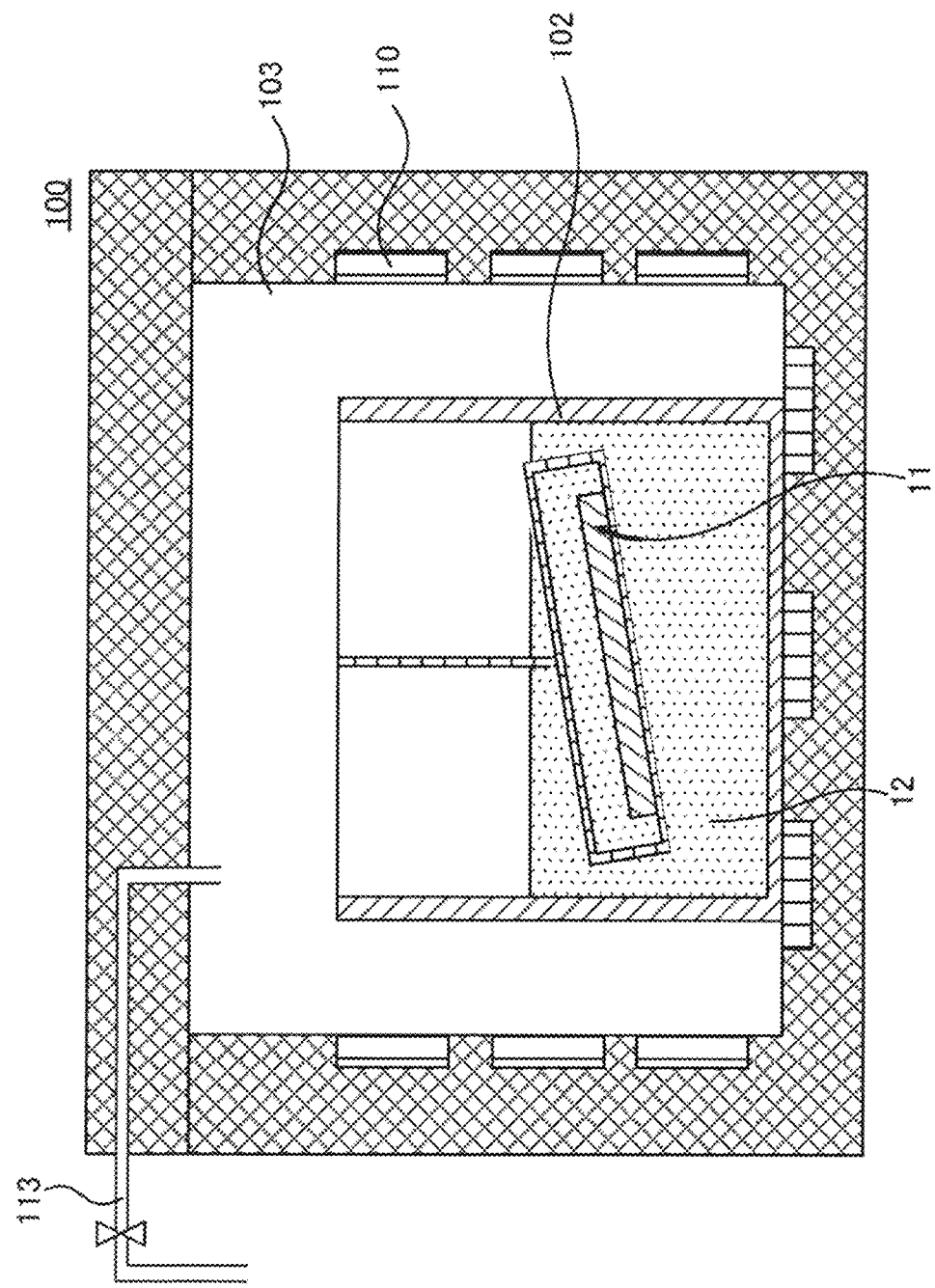
FIG. 5 is a schematic cross-sectional view of an example of the group-III nitride crystal manufacturing apparatus used in the embodiment of the present disclosure.
Figure 6:
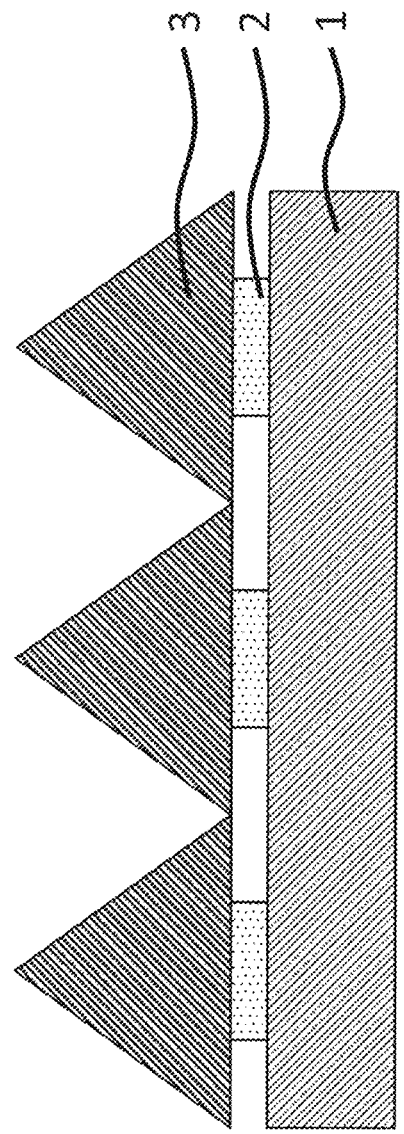
FIG. 6 is a schematic cross-sectional view of an example of a method of manufacturing a group-III nitride crystal used in the embodiment of the present disclosure.

(4-4) Subsequently, as shown in FIG. 5, the substrate 11 is immersed in a melt 12. Ga and dissolved nitrogen in the melt 12 react on surfaces of the group-III nitride seed crystals 2 so that the GaN single crystals are epitaxially grown on the group-III nitride seed crystals 2. In this state, first GaN crystals 3 having a pyramid shape shown in FIG. 6 can be obtained through immersing in the melt 12 for crystal growth for a certain time. By growing the GaN crystals in a pyramid shape, dislocations inherited from the seed crystals 2 having a dislocation density of about $10^7$ to $9/cm^2$ formed by the MOCVD method converge on apexes of pyramids so that the dislocations can be reduced.

(Lateral Growth Step)

Figure 7:
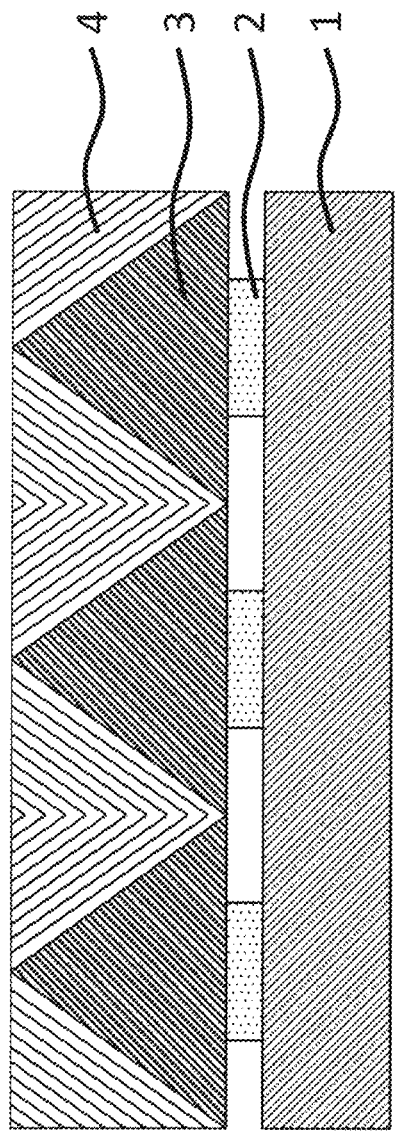
FIG. 7 is a schematic cross-sectional view of an example of the method of manufacturing a group-III nitride crystal used in the embodiment of the present disclosure.

(4-5) For the substrate 11 on which the first GaN crystals 3 having the pyramid shape are grown, as shown in FIG. 7, GaN crystals are then laterally grown to fill pyramid-shaped gaps to form a flattened surface so that GaN crystals 4 are formed as second group-III nitride crystals. Such a growth mode change probably depends on a degree of supersaturation of GaN in the melt, and the lateral growth is promoted by increasing the degree of supersaturation. A conceivable method of increasing the degree of supersaturation is to more quickly supply nitrogen to the GaN crystals. Methods of more quickly supplying nitrogen may comprise increasing a nitrogen pressure, stirring the melt, etc. If nitrogen is more quickly supplied so as to increase the degree of supersaturation as described above, a drive force of crystal growth is increased, so that a large amount of polycrystals of GaN may be generated at an interface between the melt 12 and the crucible 102 or a contact portion with the substrate holding mechanism 114 and may inhibit the growth of the GaN single crystal on the substrate 11. Therefore, the inventors allow GaN to grow at a temperature increased by 3 to 15° C., thereby suppressing polycrystals.

(Flat Thick Film Growth Step)

Figure 8:
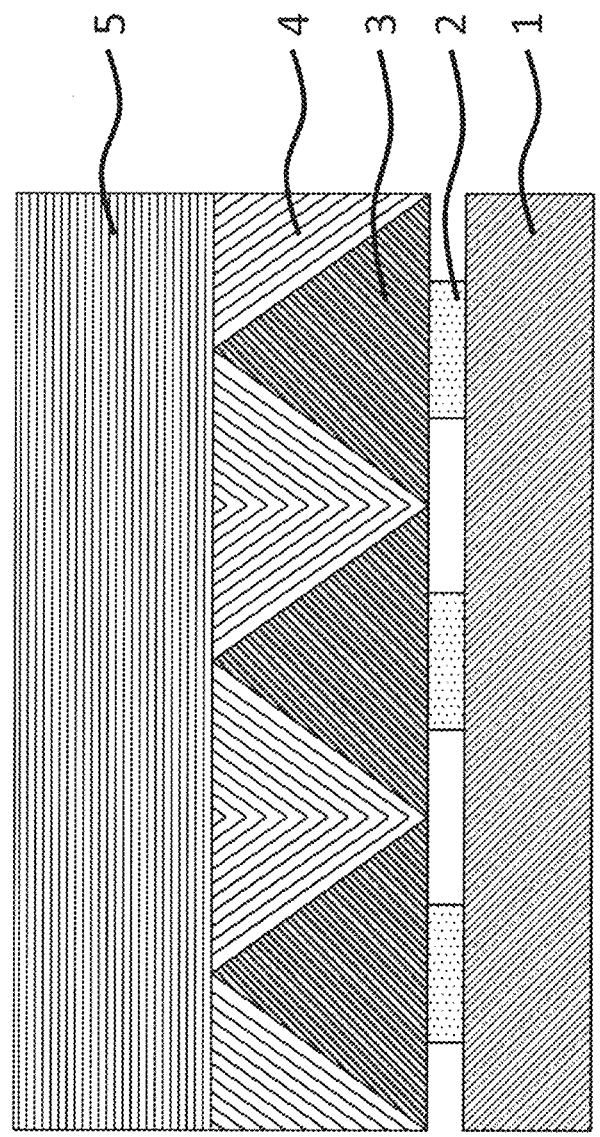
FIG. 8 is a schematic cross-sectional view of an example of the method of manufacturing a group-III nitride crystal used in the embodiment of the present disclosure.

(4-6) On the GaN crystals having the surface flattened at the lateral growth step, as shown in FIG. 8, a third group-III nitride GaN crystal 5 having a desired thickness can be grown as necessary. By thickening the third GaN crystal 5, warpage and cracks can be suppressed. For example, when the thickness of the GaN crystals (a total of 3, 4, and 5) is thinner than the seed crystal substrate 1, cracks are likely to occur in the GaN crystals, and therefore, cracks can be suppressed by increasing the film thickness of the third GaN crystal 5. The growth temperature at the flat thick film growth step is reduced by 3 to 15° C. as compared to the lateral growth step in consideration of growth rate and growth time. In this case, the dislocation density of the third GaN crystal 5 is $10^6/cm^2$ or less due to an effect of reduction of dislocations in the first GaN crystals 3.

After completion of the flat thick film growth step, it is necessary to return the temperature and pressure to normal temperature/normal pressure so as to take out the GaN crystal, and the degree of supersaturation of the melt 12 significantly varies at this timing and causes etching of the grown GaN crystal or precipitation of low quality GaN crystals if the substrate 11 is kept immersed. Therefore, after completion of the third GaN crystal growth step, the temperature and pressure may be returned to normal temperature/normal pressure while the substrate 11 is pulled up from the melt 12.

(Separation Step)

Figure 9:
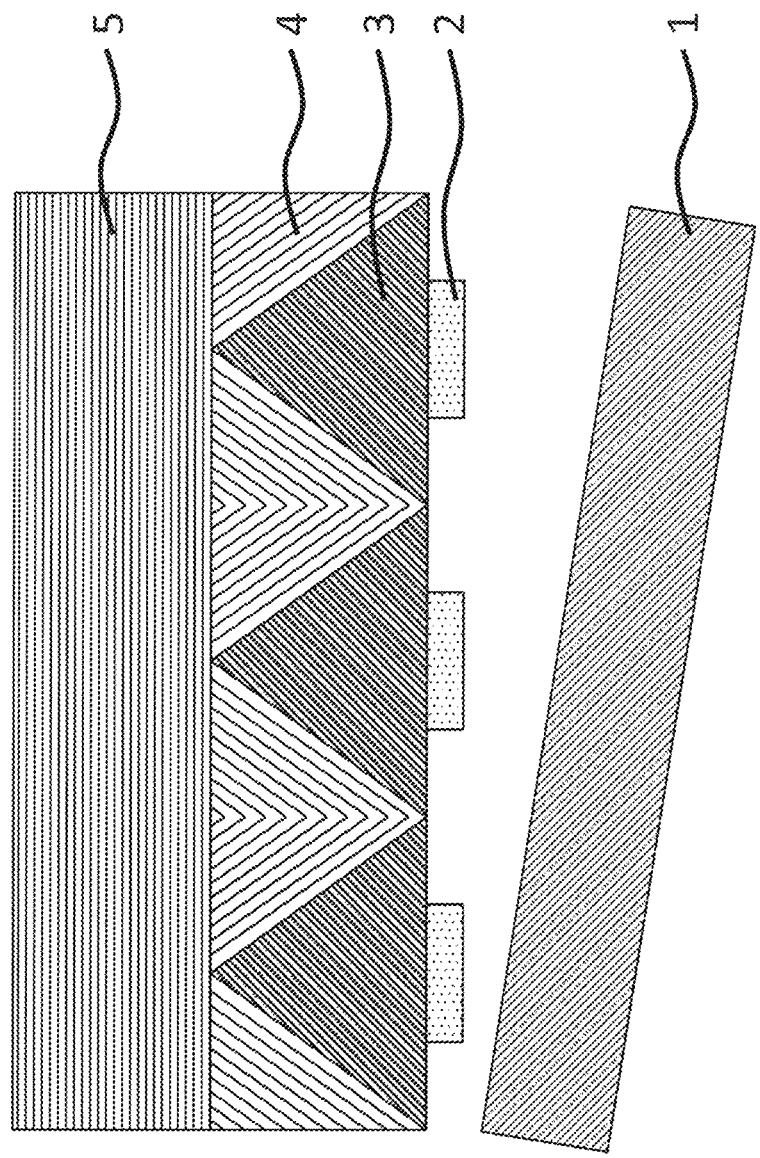
FIG. 9 is a schematic cross-sectional view of an example of the method of manufacturing a group-III nitride crystal used in the embodiment of the present disclosure.

(4-7) Lastly, the GaN crystal having a desired thickness and the seed crystal substrate 1 may be separated near the GaN seed crystals as shown in FIG. 9. By utilizing a difference in thermal expansion coefficient between the GaN crystal and the sapphire substrate generated in the process of cooling from the crystal growth temperature of 850 to 950° C. to normal temperature, the separation can be performed near the GaN seed crystals easily broken due to the smallest cross-sectional area. As a result, a large-sized GaN crystal prevented from warping and cracking can be obtained.

Figure 10:
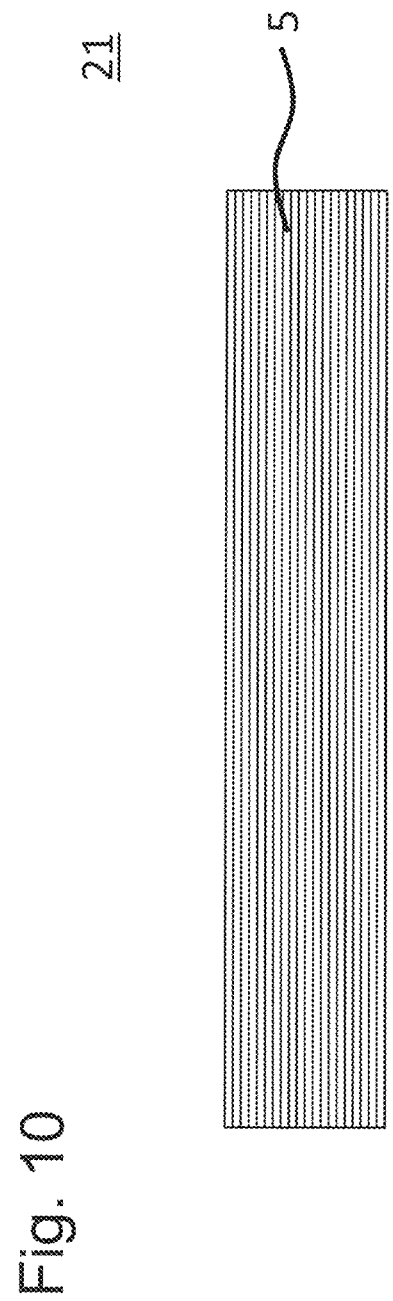
FIG. 10 is a schematic cross-sectional view of an example of the method of manufacturing a group-III nitride crystal used in the embodiment of the present disclosure.

As shown in FIG. 10, the GaN seed crystals 2 and the GaN crystals 3 and 4 are removed from the obtained large-sized GaN crystal, and a surface (an upper side of the figure) is further polished. The GaN seed crystals 2 and the GaN crystals 3 comprise a high dislocation region. The GaN crystals 3 and 4 are in a growth mode in which inclined planes such as (10-11) and (10-12) planes are exposed and have a high concentration of impurities such as oxygen. Therefore, the high-quality GaN crystal can be obtained by removing the GaN seed crystals 2 and the GaN crystals 3 and 4.

The reason why an improvement in crystallinity is limited will be described with respect to the manufacturing method of the reference example of the inventors as described above.

During the GaN growth, the first crystals 3 (pyramid shape) and the second crystals 4 (multiple group-III nitride crystal layers) have inclined planes such as (10-11) and (10-12) planes exposed, and these planes are lattice planes in which oxygen impurities are easily taken. Additionally, the third crystal 5 (flat thick film growth portion) has an exposed (0001) plane, which takes in oxygen impurities although the level is lower than the (10-11) and (10-12) planes. Members such as the substrate, Na, and Ga are prepared in a glove box in an inert gas (Ar, nitrogen) atmosphere so as to prevent adhesion of oxygen. Additionally, the inside of the manufacturing apparatus 100 is vacuumed by a pump to remove oxygen impurities in the space before the GaN crystal growth. However, even if these treatments are performed, a trace amount of oxygen is contained in a reaction apparatus. A nitrogen gas line and a nitrogen cylinder also contain a trace amount of oxygen of 1 ppm or less. A crucible material in the reaction apparatus is boron nitride (BN) or alumina ($Al_2O_3$), which has oxygen adsorptivity, and oxygen in the component may be desorbed. As described above, a trace amount of oxygen exists in the apparatus, and the trace amount of oxygen is taken into the crystal planes of GaN during growth.

On the other hand, an amount of oxygen taken in is related to a growth temperature of a GaN crystal. When the temperature is lower, the degree of supersaturation of GaN becomes lower so that the bond between Ga and nitrogen becomes weaker, and oxygen impurities are more easily released from a GaN crystal. Therefore, we consider that the oxygen taken in decreases when the temperature is relatively high.

FIG. 11 shows a microscopic image (a) and a cross-sectional CL image (b) of a cross section of a crystal obtained by growing GaN at 870° C. and then growing GaN at 890° C. A position of a circle at a central portion of the CL image (FIG. 11B) indicates a portion grown at 870° C., and a position of a right circle indicates a portion grown at 890° C. The oxygen concentration of the GaN crystal at each of the growth temperatures was measured by using secondary ion mass spectrometry (D-SIMS) for these two circle portions. As a result, it was found that the oxygen concentration of the growth layer at 870° C. was $1.0 \times 10^{20}$ atoms/$cm^3$ and the oxygen concentration of the growth layer at 890° C. was $2.0 \times 10^{19}$ atoms/$cm^3$. From this result, it is found that even with the growth temperature difference of 20° C. between 870° C. and 890° C., the concentration of oxygen taken into the GaN crystal changes about 10 times, and that a higher temperature reduces the oxygen taken in and makes the oxygen concentration in the GaN crystal lower.

Figure 12:
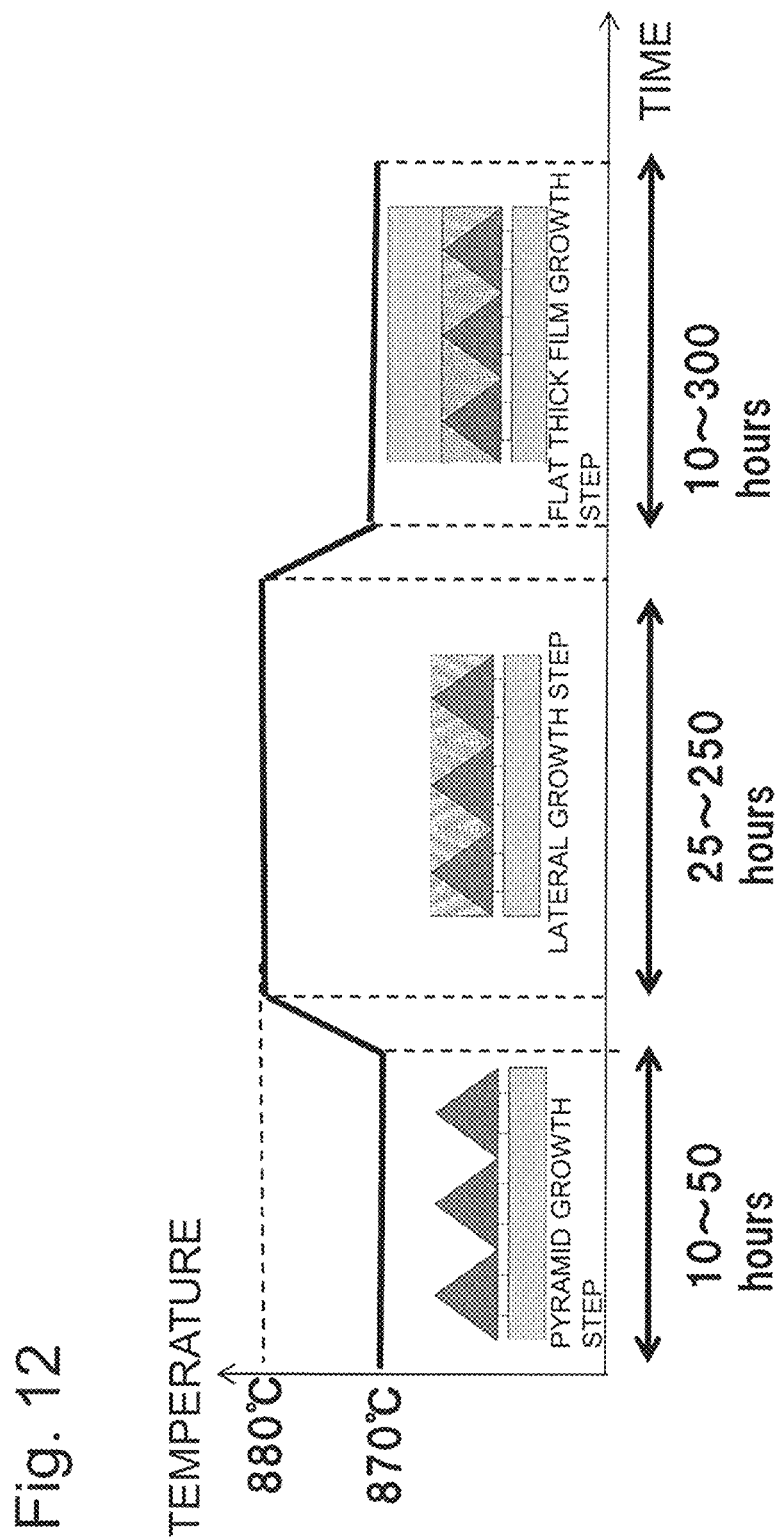
FIG. 12 is a diagram showing an example of a time-temperature relationship during GaN crystal growth of a reference example.

FIG. 12 shows an example of a relationship between time and temperature of the steps in the conventional GaN crystal growth. In the GaN crystal growth, the first crystals 3 (pyramid shape), the second crystals 4 (multiple group-III nitride crystal layers), and the third crystal 5 (flat thick film growth portion) are produced 870° C., 880° C., and 870° C., respectively, so that the three types of crystals have differences in the growth temperature. As described above, in the lateral growth step, GaN polycrystals generated due to an increase in degree of supersaturation must be suppressed, and the temperature is raised by about 10° C. From the result of SIMS, the growth region of 870° C. is considered to more easily take in oxygen than the growth region of 880° C.

Additionally, the first crystals 3 (pyramid shape) have the exposed inclined planes of (10-11) and (10-12) in which impurities are easily taken and the growth temperature of 870° C., therefore easily take in oxygen, and probably have a very high oxygen concentration as compared to the second crystals 4 (multiple group-III nitride crystal layers).

Figure 13:
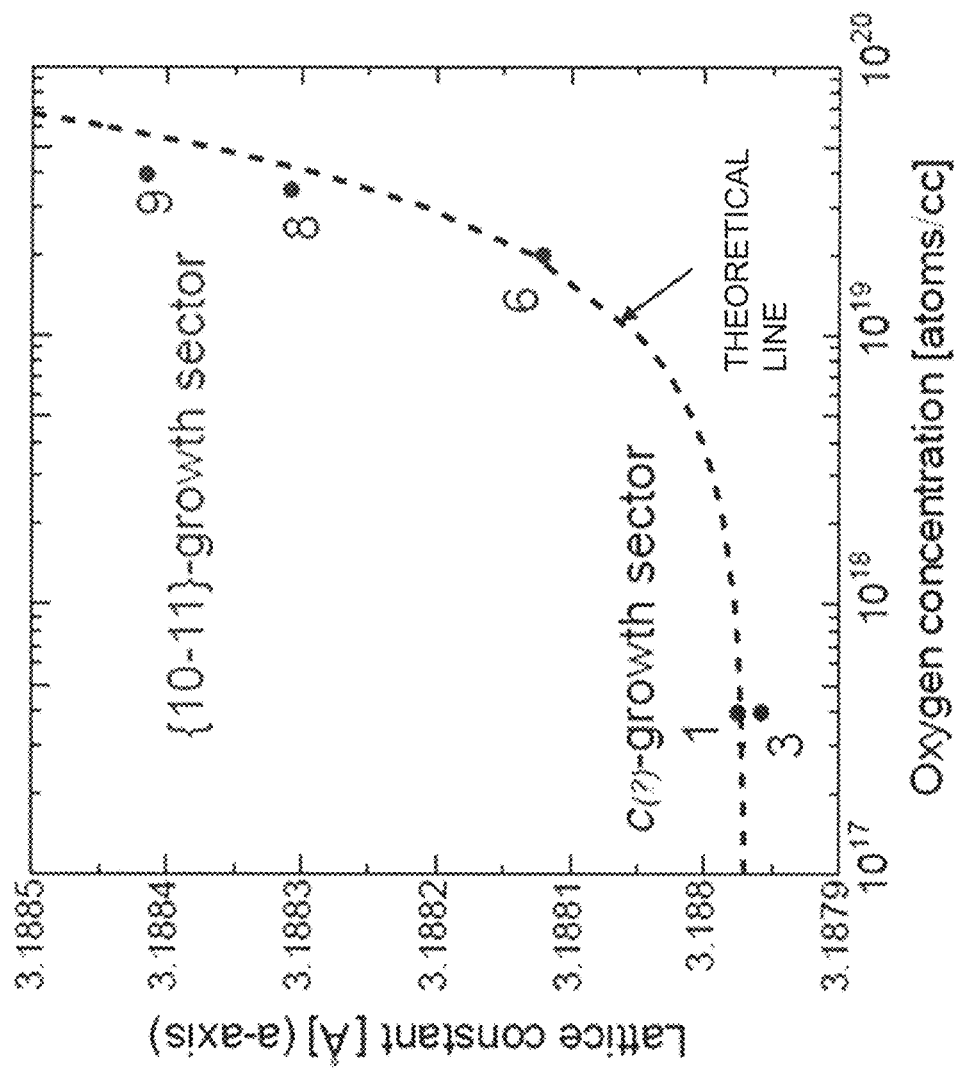
FIG. 13 is a diagram showing a relationship between an a-axis lattice constant and oxygen concentration.
Figure 14:
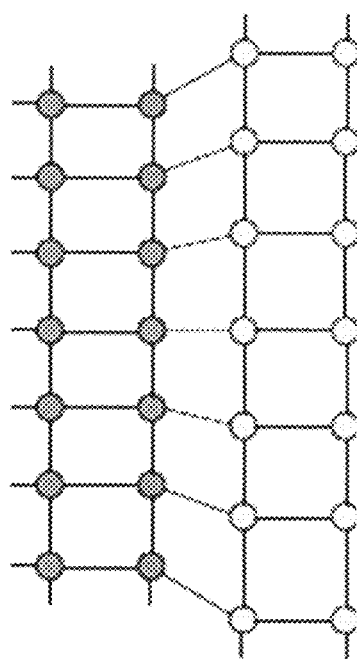
FIG. 14 is an atomic schematic diagram of a group-ill nitride crystal layer having a lattice constant difference.

On the other hand, studies by the inventors have revealed that the lattice constant of GaN crystals depends on the oxygen concentration. FIG. 13 shows a relationship between an a-axis lattice constant and oxygen concentration. This is obtained by actual measurement performed for the (10-11) plane easily taking in oxygen and the C plane ((0001) plane) hardly taking in oxygen, and the results of the lattice constant and oxygen concentration are obtained by synchrotron X-ray (Spring-8) and SIMS measurement, respectively. We found that the lattice constant exponentially increases as the oxygen concentration increases. Although these lattice constant differences are as small as 0.1% or less, when these lattice constant differences occur during GaN crystal growth, a strain occurs at an atomic level as shown in an atomic schematic diagram of the group-III nitride crystal layer having a lattice constant difference of FIG. 14, which causes a large internal stress.

For an experiment, a GaN crystal having the lattice constant of 3.1889 Å was produced by the HVPE (Hydride Vapor Phase Epitaxy) method on a GaN crystal having the lattice constant of 3.1899 Å produced by the flux method. The crystal warpage of the GaN crystal produced by the flux method was 1 μm or less, and when the GaN crystal of the HVPE method was produced thereon, the warpage was significantly increased to 5.4 μm. From this result, it was found that a large internal stress was generated between two GaN crystals having different lattice constants. Based on these findings, we concluded that a large internal stress is generated between the first crystals 3 (pyramid shape) and the second crystals 4 (multiple group-III nitride crystal layers) having different oxygen concentrations in the conventional manufacturing method of the inventors, which consequently causes a crystal strain and deterioration in crystallinity.

Based on the results and findings described above, we consider that the crystallinity is expected to be improved by reducing the growth temperature difference between the first crystals 3 (pyramid shape) and the second crystals 4 (multiple group-III nitride crystal layers) to reduce the oxygen concentration difference.

Figure 15:
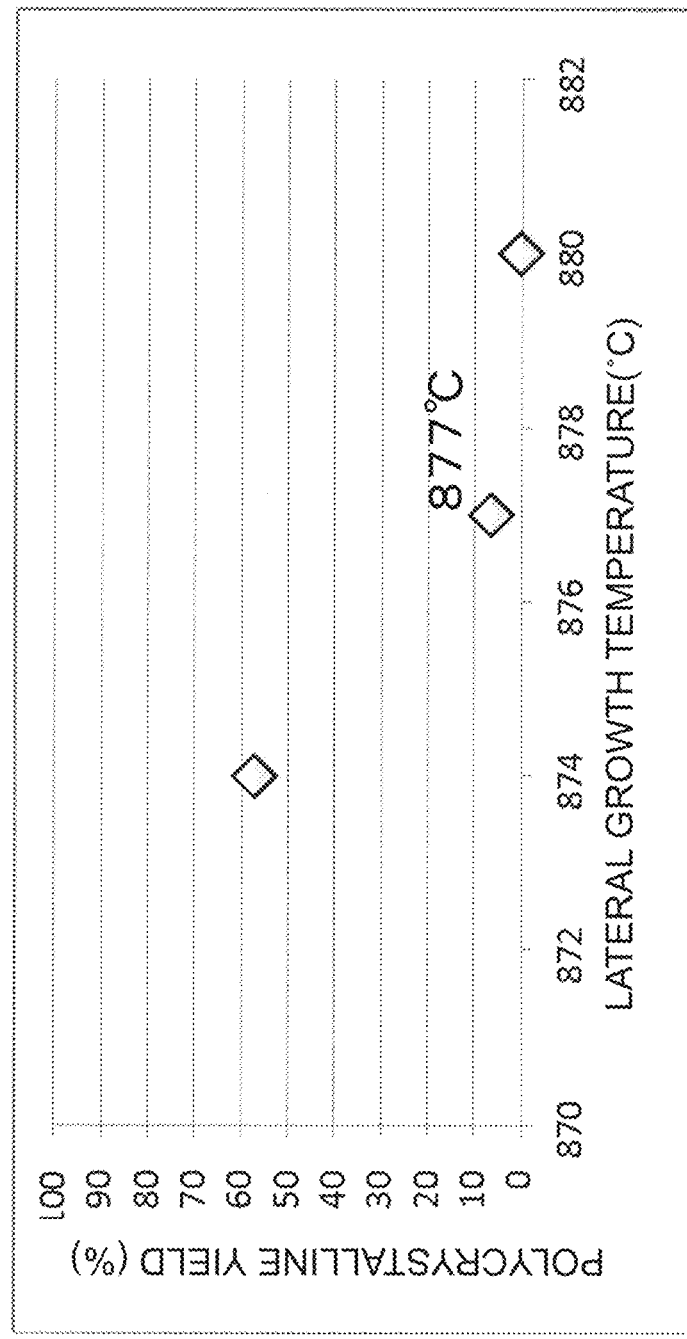
FIG. 15 is a diagram showing a relationship between lateral growth temperature and polycrystalline yield.

An effective growth temperature range of each step will be described. The relationship between the growth temperature and the generation of polycrystals will first be described. To suppress polycrystallization during growth of the second crystals 4 (multiple group-III nitride crystal layers), the relationship between the temperature of the lateral growth and the polycrystals was obtained from an experiment. FIG. 15 shows the result thereof. After the grown GaN single crystal is taken out, polycrystals remaining in the crucible 102, polycrystals adhering to the substrate holding mechanism 114, and polycrystals adhering to the substrate 11 were collected and weighed. Subsequently, a polycrystalline yield was obtained through comparison with an input amount of Ga. It is seen that as the growth temperature becomes lower and the degree of supersaturation of GaN in the melt rises, the amount of polycrystals increases. Increased polycrystals not only inhibit the growth of the GaN crystal but also cause interference at the time of pull-up of the substrate 11 from the state of FIG. 5 due to adhesion of the polycrystals to the crucible 102, which may result in damage to the substrate. We have found from the experiment that when the polycrystal yield is 10% or less, the inhibition of growth of the GaN crystal can be avoided and the substrate 11 can normally be pulled up. Therefore, we have concluded that the lateral growth may be performed at a temperature of 877° C. or more.

Figure 16:
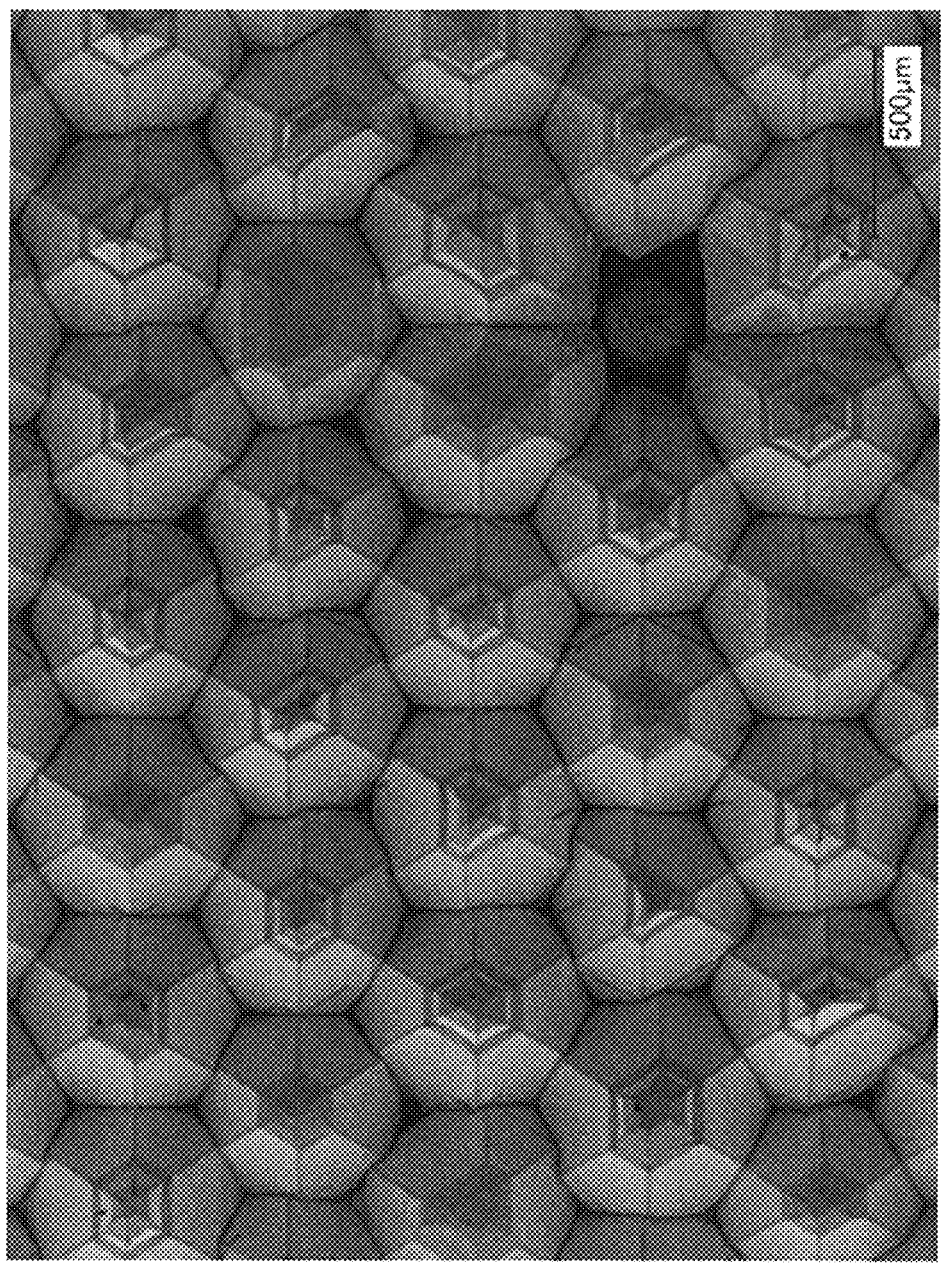
FIG. 16 is an SEM image for explaining nucleation.
Figure 17:
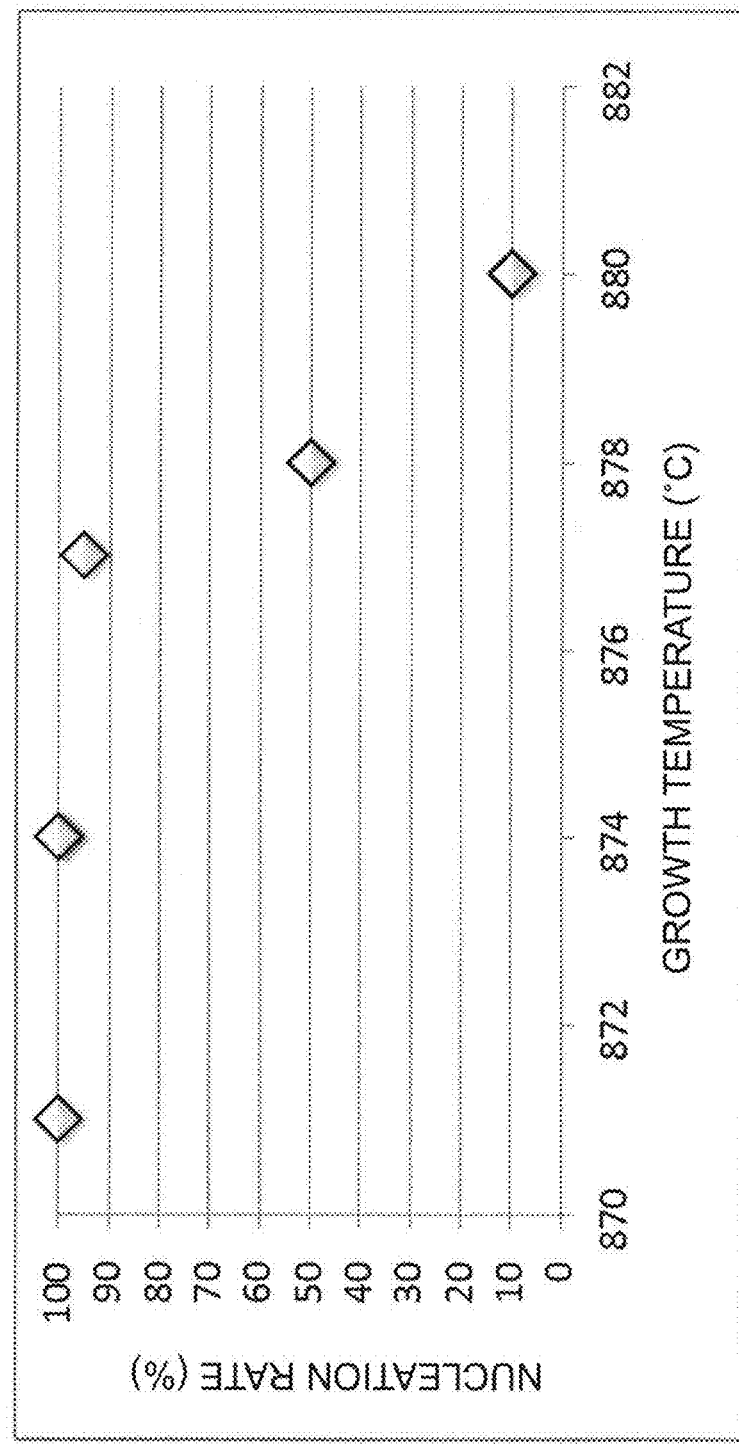
FIG. 17 is a diagram showing a relationship between pyramid growth temperature and nucleation rate.
Figure 18:
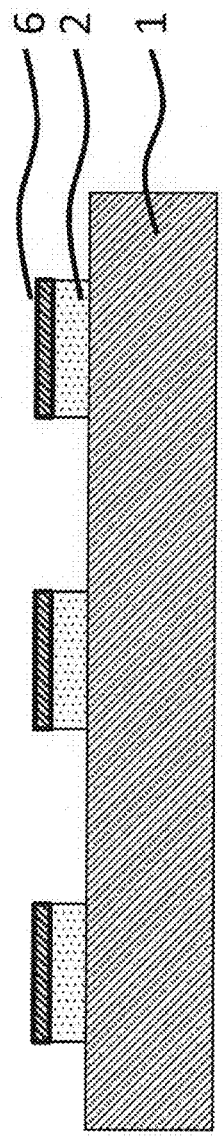
FIG. 18 is an explanatory diagram of nucleation.

On the other hand, we have found that an effective growth temperature range exists for nucleation at an early stage of GaN growth. The nucleation in this case refers to an action of the flux method forming new GaN crystals on the dot-shaped group-III nitride seed crystals 2 arranged on the seed crystal substrate 1 and is caused by applying a certain drive force at an earliest stage of pyramid growth. As shown in FIG. 18, at the earliest stage of GaN growth, crystal nuclei 6 of group-III nitride crystals are generated on the group-III nitride seed crystals 2. After the crystal nuclei 6 are generated, the first crystals 3 (pyramid shape) can grow normally. To increase the drive force causing the nucleation, the degree of supersaturation of GaN must be increased, and the inventors examined the temperature at which the nucleation appropriately occurs through experiments. FIG. 16 shows a case of insufficient nucleation as an SEM image of crystal surfaces. The SEM image was obtained by using IMAGING CL OF-100 (HORIBA, Ltd.). Hexagonally-grown portions are positions formed into a pyramid shape after normal nucleation from the dot-shaped group-III nitride seed crystals 2, and an ungrown portion looking like a black dot is an abnormal position. When the temperature becomes higher than a certain level and the degree of supersaturation decreases, the number of abnormal positions as shown in FIG. 16 stochastically increases. FIG. 17 shows the relationship between the growth temperature and the nucleation rate obtained by the inventors through experiments. The nucleation rate was calculated by the number of hexagonally grown portions/the total number of dots from crystal surface SEM images. From the obtained relationship, we found that a temperature of 874° C. or less is required for complete nucleation on a substrate.

The drive force is required for forming the crystal nuclei 6 of the GaN crystals, and the temperature must be set to 874° C. or less to increase the degree of supersaturation at the earliest stage of the growth; however, once the crystal nuclei 6 of the GaN crystals are formed, a large drive force is not required, and the degree of supersaturation may not necessarily made high. In other words, the degree of supersaturation raised for the nucleation may be lowered when the subsequent growth of the first crystals 3 (pyramid shape). Therefore, we consider that it is appropriate to perform low temperature growth in a short time before high temperature growth of the first crystals 3 (pyramid shape) and the second crystals 4 (multiple group-III nitride crystal layers). As a result, we concluded that this can satisfy the complete nucleation, the lateral growth without polycrystallization, and the improvement in crystallinity expected from a reduction in the growth temperature difference between the first crystals 3 (pyramid shape) and the second crystals 4 (multiple group-III nitride crystal layers).

After repeating such hypothesis construction and experiments, we specifically demonstrated the manufacturing of GaN crystal. As a result, the present inventor completed a method of manufacturing a group-III nitride crystal according to the present invention.

The method of manufacturing a group-III nitride crystal according to an embodiment of the present disclosure will now be described by taking as an example an embodiment in which a GaN crystal is produced as a group-III nitride crystal.

First Embodiment

Figure 19:
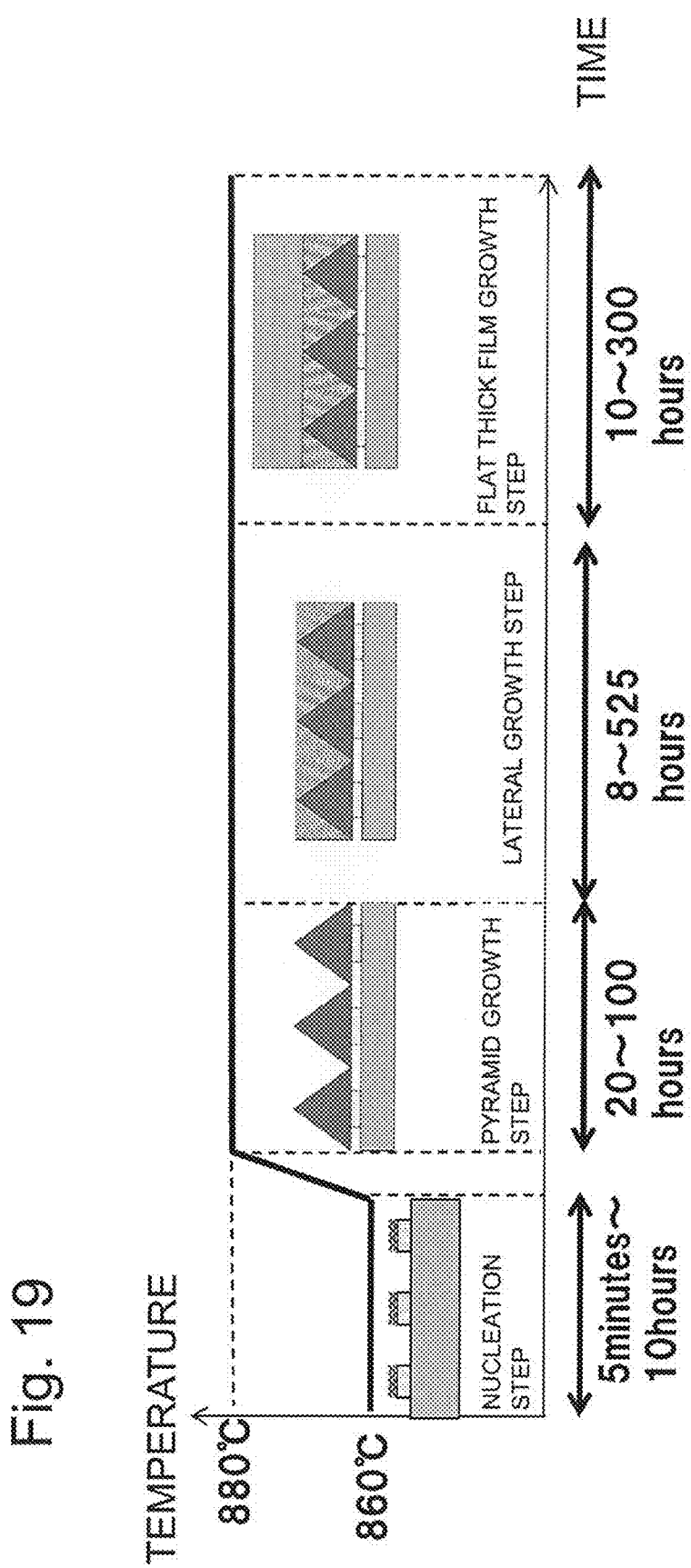
FIG. 19 is a diagram showing an example of a time-temperature relationship during GaN crystal growth of the present disclosure.

A method of manufacturing a group-III nitride crystal according to a first embodiment of the present disclosure will hereinafter be described while being compared with the method of manufacturing a group-III nitride crystal of the reference example, with reference to a diagram of FIG. 19 showing an example of a time-temperature relationship during GaN crystal growth. The seed crystal preparation step is the same as the method of manufacturing a group-III nitride crystal in the reference example and therefore will not be described.

(Nucleation Step)

(a) First, Na serving as a flux and a group-III element Ga are put into the crucible 102 in the reaction chamber 103 of the manufacturing apparatus 100.

(b) The inside of the reaction chamber 103 is sealed, the temperature of the crucible is adjusted to 800° C. or more and 1000° C. or less, and nitrogen gas is sent into the reaction chamber 103. In this case, the gas pressure in the reaction chamber 103 is set to $1 \times 10^6$ Pa or more and $1 \times 10^7$ Pa or less.

(c) Subsequently, holding or stirring and mixing etc. are performed until Na, Ga, and the trace additive are uniformly mixed.

(d) The inside of the reaction chamber 103 is then set to a temperature required for nucleation. Although a high degree of supersaturation is required for the nucleation and the nucleation occurs at a low temperature of 874° C. or less, an excessively high degree of supersaturation forms a starting point of polycrystals during nucleation and is therefore not desirable. Thus, the temperature range is desirably set to a temperature of 850° C. or more and 874° C. or less. The reaction chamber 103 is set in this temperature range, and this state is maintained for 1 to 5 hours until the temperature stabilizes. The temperature of the flux has a followability slower than the temperature of the reaction chamber 103 and requires a stabilization time.

Figure 20:
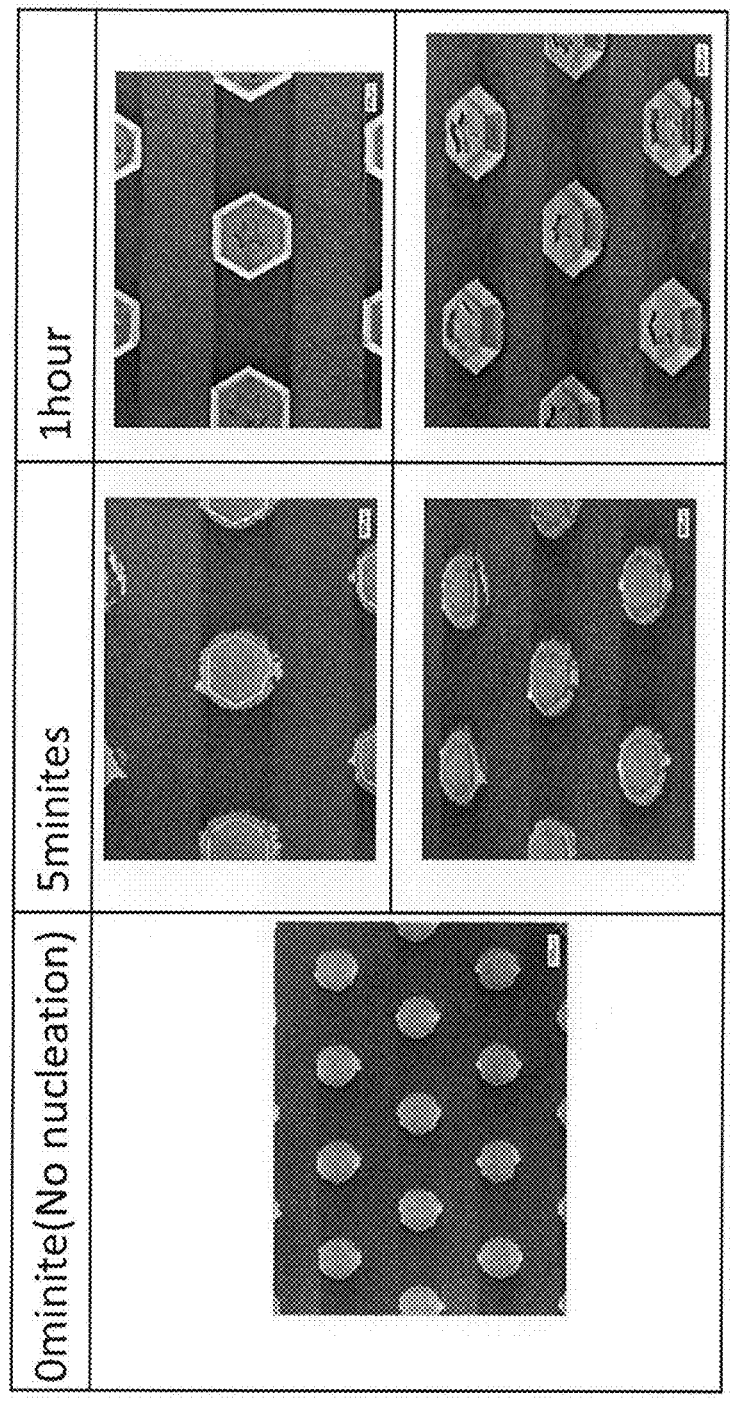
FIG. 20 is an SEM image showing time dependency of nucleation.

(e) After the temperature stabilizes, the substrate 11 is immersed in the melt 12 as shown in FIG. 5. After immersion, nitrogen starts reacting on the surfaces of the seed crystals 2 and nucleation begins. A suitable immersion time for the nucleation is 5 minutes to 10 hours. FIG. 20 shows an SEM image showing the time dependency of the nucleation after immersion which is obtained by the inventors through experiments. It is seen that a hexagonal shape begins to appear in 5 minutes after immersion. No nucleation occurs in a shorter time, and the group-III nitride seed crystals 2 are not grown at all even if the method goes to the pyramid growth step. In this way, the nucleation occurs in a short time as compare to the crystal growth time of the subsequent steps if the degree of supersaturation is high. On the other hand, if the immersion time becomes longer while the degree of supersaturation is high, the starting point of polycrystals is formed. The polycrystals are generated not only in the crucible 102 but also on the surface of the seed crystal substrate 11, and therefore, if polycrystals are generated at the nucleation step, the subsequent steps are hindered. From the experiments, we found that if the immersion time was 10 hours or less, no polycrystalline starting point is formed. Therefore, the immersion time for nucleation is desirably 5 minutes to 10 hours.

(Pyramid Growth Step)

(f) After completion of the nucleation step, the method goes to the pyramid growth step of obtaining the first crystals 3 (pyramid shape). The pyramid growth step is performed at 877° C. or more so as to reduce the concentration of oxygen taken in and reduce the growth temperature difference from the lateral growth as described above. From the nucleation temperature of 850° C. to 874° C. to the pyramid growth temperature of 877° C. or more, the temperature is increased for 15 minutes to 2 hours. When the temperature is increased, the substrate 11 may be once pulled up into the air as shown in FIG. 11 or may be kept immersed as shown in FIG. 12. If once pulled up into the air, the substrate 11 is immersed again as shown in FIG. 12 after a temperature stabilization time of 1 to 5 hours. The pyramid growth time may be 20 hours to 100 hours. If the time is shorter or longer than this time, a GaN crystal with many dislocations grows during the next second GaN crystal growth. By growing the crystals in this way, the first GaN crystals 3 having the pyramid shape shown in FIG. 6 can be obtained.

(Lateral Growth Step)

(g) For the substrate 11 on which the first GaN crystals 3 having the pyramid shape are grown, as shown in FIG. 7, GaN crystals are laterally grown by controlling the degree of supersaturation of GaN in the melt so that the second GaN crystals 4 are formed. Control of temperature, pressure, and agitation of melt may be available for controlling the degree of supersaturation; however, the degree of supersaturation sufficient for the lateral growth cannot be obtained by simply controlling them. Suppression of polycrystallization is also difficult. Therefore, the lateral growth is performed by a technique in which the immersion in the melt 12 and the pulling-up from the melt 12 are repeated multiple times by alternately repeating the states of FIGS. 4 and 5 so as to grow the second GaN crystals 4 such that the pyramid-shaped gaps are filled to form a flattened surface as shown in FIG. 5. The nitrogen concentration in the melt becomes higher toward the melt surface since nitrogen dissolves from the melt surface, and the GaN crystals are effectively grown at the melt surface for achieving a high degree of supersaturation. However, it is very difficult to hold the substrate 11 at the melt surface with high accuracy for a long time in a high-temperature high-pressure container and in a situation where crystal growth and raw material consumption occur at the same time.

Therefore, the inventors considered that a thin coat of the melt is formed on the surface of the substrate 11 by immersing and pulling up the substrate 11 in the melt 12 and succeeded in achieving a growth mode in which a surface becomes flat when conducted experiments. On the other hand, we found that since the GaN crystals are grown from the coat-shaped melt, Ga in the melt is depleted as the crystals grow, resulting in the stop of the growth. Therefore, we devised a second GaN crystal growth step in which immersion and pull-up are repeated multiple times so as to achieve a growth thickness required for filling the pyramid-shaped gaps.

To stably form the coat-shaped melt on the entire surface of the substrate 11, the substrate 11 may be inclined by about 5 to 15 degrees relative to the liquid surface of the melt 12. By inclining within this range, the coat can be controlled to a suitable thickness by a balance of the surface shape of the substrate 11, the surface tension of the melt 12, and the gravity, and the melt can be prevented from accumulating on the substrate 11.

For example, the time of immersion in the melt 12 is 0 to 3 minutes, and the time of pull-up from the melt 12 is 10 to 60 minutes. The number of times of immersion/pull-up may be about 50 to 500 times. For example, the second GaN crystals 4 having a flat surface was obtained by setting the immersion time to 0 minutes and the time of pull-up from the melt to 30 minutes and repeating the immersion/pull-up about 200 times. In this case, as shown in FIG. 19, about 8 to 525 hours are required for the lateral grow (excluding the time for the immersion/pull-up).

The growth temperature at the lateral growth step is set to 877° C. or more as described above from the viewpoint of suppression of polycrystallization. On the other hand, since the pyramid growth temperature is also set to 877° C. or more, the first crystals (pyramid shape) and the second crystals both have a low oxygen concentration and a small temperature difference, and therefore, a lattice mismatch in GaN is small. For example, the pyramid growth step and the lateral growth step are set to the same temperature. This can eliminate the difference in oxygen concentration and the lattice mismatch to further increase the crystallinity. As shown in FIG. 19, for example, favorable crystals can be obtained by performing the pyramid growth step and the lateral growth step at 880° C.

(Flat Thick Film Growth Step)

(h) On the GaN crystals having the surface flattened at the second GaN crystal growth step, as shown in FIG. 8, the third GaN crystal 5 having a desired thickness can be grown as necessary. As with the reference example, the substrate 11 is immersed in the melt 12 for the growth. The temperature in this case is desirably set to 875 to 885° C. so as to eliminate an influence of a starting point of polycrystals generated during the pyramid growth or the lateral growth. In this temperature range, the degree of supersaturation is small, so that even if the starting point of polycrystal exists, polycrystals hardly grow from the point. Additionally, since the second crystals 4 formed by lateral growth are produced at 877° C. or more, the temperature range of 875 to 885° C. is desirable in terms of prevention of lattice mismatch through reduction in the temperature difference between the second crystals 4 and the third crystal 5. For example, the crystal growth temperature is made the same as the lateral growth temperature. Since the difference in oxygen concentration is eliminated so that no lattice mismatch occurs, the crystallinity is expected to be further improved. If the influences of the starting point of polycrystals and the lattice mismatch are negligibly small, the degree of supersaturation may be increased, and the temperature may be set to 870 to 874° C. for growth, so as to prioritize the growth rate. The effect of suppressing cracks by producing a thick GaN crystal is the same as the conventional method. After the thick film is grown to form the third GaN crystal 5, the substrate 11 is pulled up from the melt 12, and the temperature and pressure are returned to normal temperature/normal pressure.

(Separation Step)

(i) Lastly, the GaN crystal having a desired thickness and the seed crystal substrate 1 are separated. By utilizing a difference in thermal expansion coefficient between the GaN crystal and the sapphire substrate, the separation can be performed near the GaN seed crystals easily broken due to the smallest cross-sectional area.

The GaN seed crystals 2 and the GaN crystals 3 and 4 are removed from the GaN crystal obtained by these methods, and the surface is polished to complete a GaN wafer.

Figure 21:
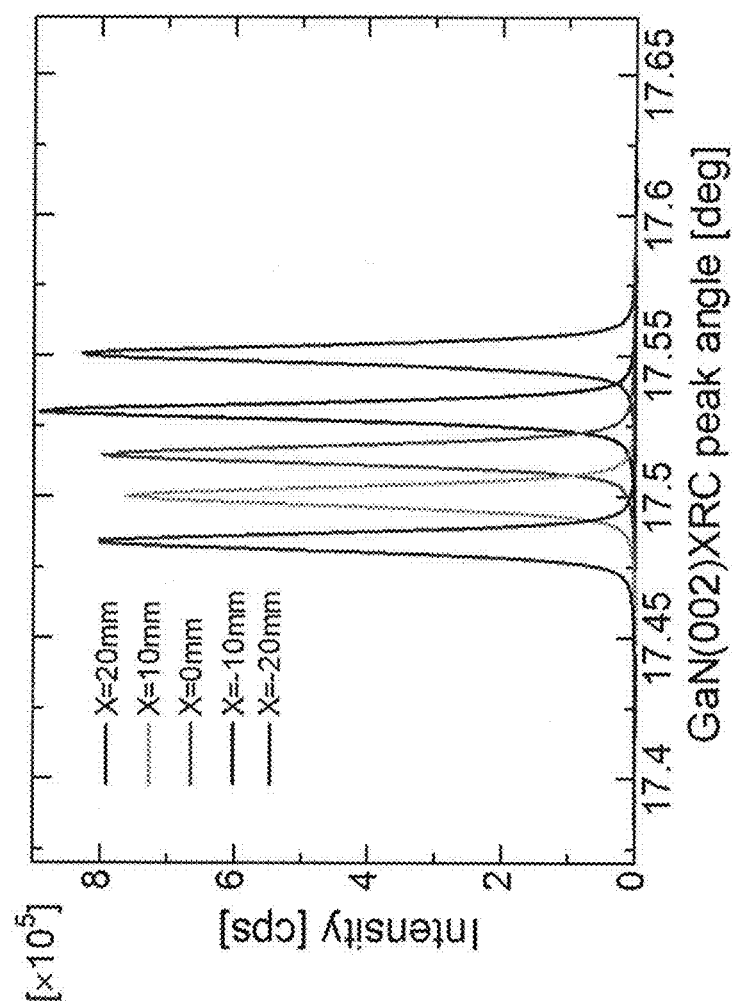
FIG. 21 is XRC of a group-III nitride crystal created by the method of manufacturing a group-III nitride crystal of the present disclosure.
Figure 22:
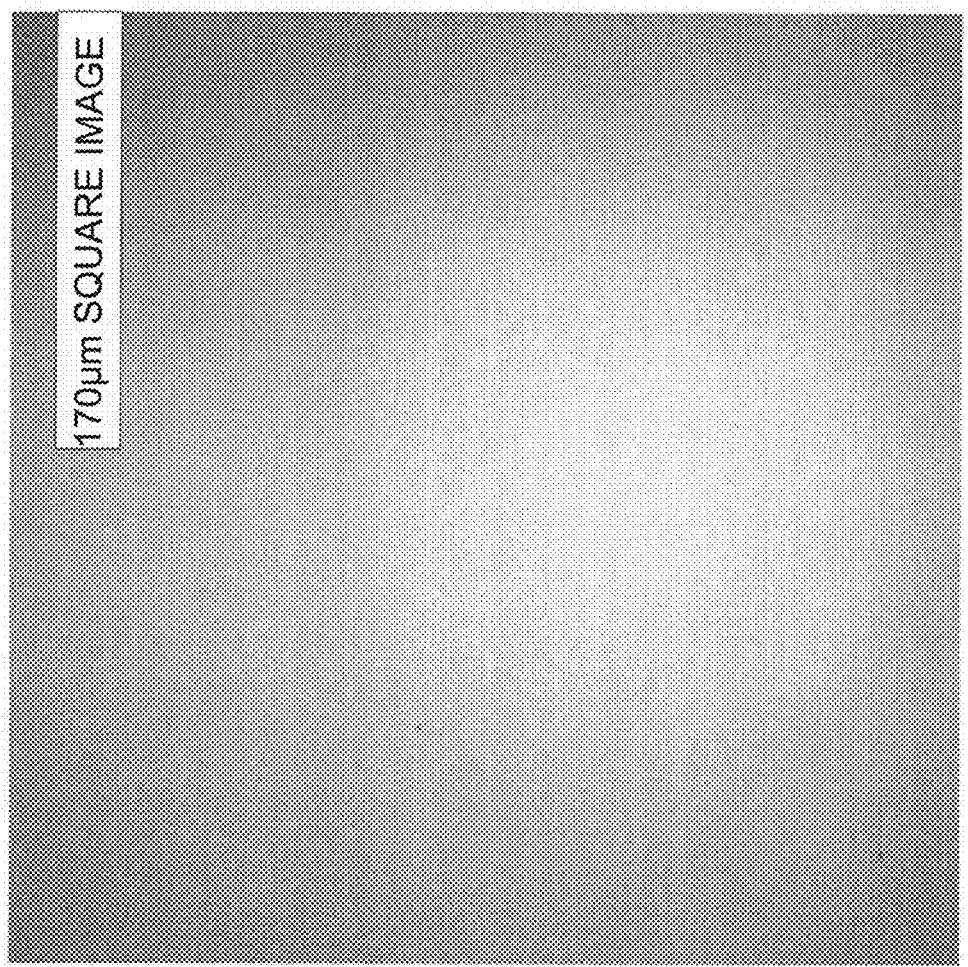
FIG. 22 is a surface dislocation image (170 μm square field image) of a group-III nitride crystal produced by the method of manufacturing a group-III nitride crystal of the present disclosure.

FIGS. 21 and 22 respectively show results of XRC measurement and measurement of a CL image taken by imaging a 170 μm square crystal surface of the completed GaN substrate. The XRC of FIG. 21 was obtained by using a fully automatic multipurpose X-ray diffractometer Smart-Lab (manufactured by RIGAKU), and the CL image of FIG. 22 was obtained by using IMAGING CL DF-100 (HORIBA, Ltd.). In the XRC of FIG. 21, peaks shift from a low angle to a high angle in accordance with changes from X=20 to X=−20. From the XRC measurement results, it was found that the crystallinity was 24 to 29 arcsec. The crystallinity was 40 arcsec or less at all measurement points and was significantly be increased as compared to the manufacturing method of the reference example of the inventors. From the CL image, it was found that the dislocation density was $6.9 \times 10^3$ $cm^{-2}$. This is about $1/100$ of the dislocation density of the reference example, and it was found that defects were significantly reduced. When the group-III nitride crystal is applied to a power device, a crystallinity of 40 arcsec or less and a dislocation density of $10^3$ $cm^{-2}$ to $10^4$ $cm^{-2}$ are desirable. From the evaluation results, we considered that the GaN manufacturing method of the present disclosure was able to satisfy the quality of crystals required for power devices.

Other Embodiments

In the embodiment, an electrical conductivity and a band gap of obtained GaN can be adjusted by adding a trace additive along with Na and Ga. Examples of the trace additive comprise boron (B), thallium (Tl), calcium (Ca), compounds containing calcium (Ca), silicon (Si), sulfur (S), selenium (Se), tellurium (Te), carbon (C), oxygen (O), aluminum (Al), indium (In), alumina ($Al_2O_3$), indium nitride (InN), silicon nitride ($Si_3N_4$), silicon oxide ($SiO_2$), iridium oxide ($In_2O_3$), zinc (Zn), magnesium (Mg), zinc oxide (ZnO), magnesium oxide (MgO), and germanium (Ge). These trace additives may be added alone or in combination of two or more.

Although the form of using Na as a flux has been demonstrated, the present disclosure is not limited thereto, and alkali metal other than Na may be used. Specifically, the flux may contain at least one selected from the group consisting of Na, Li, K, Rb, Cs, and Fr, and may be a mixed flux of Na and Li, for example.

Although a mode of producing a GaN crystal as a group-III nitride has been described above, the present disclosure is not limited thereto. The Group-III nitride of the present disclosure can be a binary, ternary, or quaternary compound containing a group-III element (Al, Ga, or In) and nitrogen and can be, for example, a compound represented by a general formula $Al_{1-x-y}Ga_yIn_xN$ (Where x and y satisfy $0 \leq x \leq 1$, $0 \leq y \leq 1$, $0 \leq 1-xy \leq 1$). The group-III nitride may contain p-type or n-type impurities. Although GaN has been also described as the material of the group-III nitride seed crystal 2, the compound described above can be used.

By using the method of manufacturing a group-III nitride crystal according to the present disclosure, a high-quality group-III nitride crystal with less crystal defects and impurities can be obtained and, for example, a high-performance power device with low electrical loss even at high voltage/high temperature can be produced.

EXPLANATIONS OF LETTERS OR NUMERALS 1 seed crystal substrate
2 group-III nitride seed crystal
3 first group-III nitride crystal (pyramid shape)
4 second group-III nitride crystal (multiple group-III nitride crystal layers)
5 third group-III nitride crystal (flat thick film growth portion)
6 crystal nucleus of group-III nitride crystal
11 substrate including group-III nitride crystal
12 melt containing group-III element and alkali metal
21 group-III nitride crystal
100 manufacturing apparatus
102 crucible
103 reaction chamber
110 heater
113 nitrogen gas supply line
114 substrate holding mechanism

What is claimed is:

1. A method of manufacturing a group-III nitride crystal comprising:
 a seed crystal preparation step of preparing a plurality of dot-shaped group-III nitrides on a substrate as a plurality of seed crystals for growth of a group-III nitride crystal; and
 a crystal growth step of bringing surfaces of the seed crystals into contact with a melt comprising an alkali metal and at least one group-III element selected from the group consisting of gallium, aluminum, and indium in an atmosphere comprising nitrogen and thereby reacting the group-III element with the nitrogen in the melt to grow the group-III nitride crystal,
 wherein the crystal growth step comprises:
  a nucleation step of forming a plurality of crystal nuclei from the plurality of seed crystals;
  a pyramid growth step of growing a plurality of pyramid-shaped first group-III nitride crystals from the plurality of crystal nuclei;
  a lateral growth step of growing second group-III nitride crystals so that gaps of the plurality of pyramid-shaped first group-III nitride crystals are filled to form a flattened surface; and
  a flat thick film growth step of growing a third group-III nitride crystal having a flat surface after the lateral growth step;
 wherein the nucleation step is performed at 874° C. or less, the pyramid growth step is performed at a crystal growth temperature of 877° C. or more, the lateral growth step is performed at a crystal growth temperature of 877° C. or more, and the flat thick film growth step is performed at 862° C. to 874° C.

2. The method of manufacturing a group-III nitride crystal according to claim 1, wherein at the nucleation step, the plurality of seed crystals are immersed in the melt within 5 minutes to 10 hours.

3. The method of manufacturing a group-III nitride crystal according to claim 1, wherein at the lateral growth step, multiple group-III nitride crystal layers are formed on inclined planes of the pyramid-shaped first group-III nitride crystals by repeatedly immersing the substrate into the melt and pulling up the substrate from the melt.

4. The method of manufacturing a group-III nitride crystal according to claim 1, wherein the pyramid growth step is performed at the same temperature as the crystal growth temperature of the lateral growth step.

5. The method of manufacturing a group-III nitride crystal according to claim 1, further comprising a step of separating the group-III nitride crystal and the substrate after the crystal growth step.

6. The method of manufacturing a group-III nitride crystal according to claim 1, wherein the flat thick film growth step is performed at 870° C. to 874° C.

* * * * *